United States Patent
Zissing et al.

(10) Patent No.: US 10,112,237 B2
(45) Date of Patent: Oct. 30, 2018

(54) DEVICE FOR DRYING AND SINTERING METAL-CONTAINING INK ON A SUBSTRATE

(71) Applicant: Heraeus Noblelight GmbH, Hanau (DE)

(72) Inventors: Holger Zissing, Flieden (DE); Jürgen Weber, Kleinostheim (DE); Sven Linow, Darmstadt (DE); Oliver Weiss, Heusenstamm (DE)

(73) Assignee: Heraeus Noblelight GmbH, Hanau (DE)

( * ) Notice: Subject to any disclaimer, the term of this patent is extended or adjusted under 35 U.S.C. 154(b) by 519 days.

(21) Appl. No.: 14/787,718

(22) PCT Filed: Apr. 10, 2014

(86) PCT No.: PCT/EP2014/057258
§ 371 (c)(1),
(2) Date: Oct. 28, 2015

(87) PCT Pub. No.: WO2014/177354
PCT Pub. Date: Nov. 6, 2014

(65) Prior Publication Data
US 2016/0074941 A1    Mar. 17, 2016

(30) Foreign Application Priority Data

May 3, 2013  (DE) .................. 10 2013 104 577

(51) Int. Cl.
*B22F 3/10*  (2006.01)
*B22F 7/00*  (2006.01)
(Continued)

(52) U.S. Cl.
CPC ............... *B22F 7/08* (2013.01); *B22F 3/10* (2013.01); *B22F 7/008* (2013.01); *F26B 3/30* (2013.01);
(Continued)

(58) Field of Classification Search
None
See application file for complete search history.

(56) References Cited

U.S. PATENT DOCUMENTS 5,567,237 A     10/1996  Kapp-Schwoerer et al.
9,845,404 B2 *  12/2017  Uchida ................. C09D 11/52
(Continued)

FOREIGN PATENT DOCUMENTS

CN      102948267 A      2/2013
DE   102010015659 A1    10/2011
(Continued)

OTHER PUBLICATIONS

International Search Report dated Jun. 6, 2014 in International Application No. PCT/EP2014/057258.
(Continued)

*Primary Examiner* — Joseph M Pelham
(74) *Attorney, Agent, or Firm* — Panitch Schwarze Belisario & Nadel LLP

(57) ABSTRACT

A device for drying and sintering metal-containing ink on a substrate enables homogeneous irradiation of the substrate, has compact construction, and is simple and economical to produce. Optical infrared radiators have a cylindrical radiator tube and a longitudinal axis, and emit radiation having an IR-B radiation component of at least 30% and an IR-C radiation component of at least 5% of total radiator output power. The radiators are arranged in a module with their longitudinal axes running parallel to each other and transverse to the transport direction. They thereby irradiate on the
(Continued)

surface of the substrate an irradiation field, which is divided into a drying zone and a sintering zone arranged downstream of the drying zone in the transport direction. The drying zone is exposed to at least 15% less average irradiation density than the sintering zone along a center axis running in the transport direction.

13 Claims, 2 Drawing Sheets

(51) Int. Cl.
| | |
|---|---|
| *B22F 7/08* | (2006.01) |
| *F27B 9/06* | (2006.01) |
| *F27B 9/12* | (2006.01) |
| *F27B 9/36* | (2006.01) |
| *F26B 3/30* | (2006.01) |
| *H01L 21/67* | (2006.01) |
| *H05K 3/12* | (2006.01) |
| *H05K 3/22* | (2006.01) |
| *H01L 21/677* | (2006.01) |
| *H05K 1/09* | (2006.01) |

(52) U.S. Cl.
CPC ........ *F27B 9/066* (2013.01); *H01L 21/67034* (2013.01); *H01L 21/6776* (2013.01); *H01L 21/67115* (2013.01); *H05K 3/1283* (2013.01); *H05K 3/227* (2013.01); *F27B 2009/122* (2013.01); *F27B 2009/3607* (2013.01); *H05K 1/092* (2013.01); *H05K 2203/1131* (2013.01); *H05K 2203/1476* (2013.01)

(56) References Cited

U.S. PATENT DOCUMENTS

| | | | |
|---|---|---|---|
| 2001/0046379 A1 | 11/2001 | Grob et al. | |
| 2002/0091497 A1 | 7/2002 | Ruck | |
| 2006/0163744 A1* | 7/2006 | Vanheusden | B82Y 30/00 257/773 |
| 2006/0292777 A1* | 12/2006 | Dunbar | H01L 21/02554 438/197 |
| 2008/0286488 A1* | 11/2008 | Li | B22F 1/0074 427/541 |
| 2009/0090272 A1* | 4/2009 | Toyoda | C09D 11/38 106/31.92 |
| 2009/0128290 A1* | 5/2009 | Chopra | G06K 19/0672 340/10.1 |
| 2009/0145640 A1* | 6/2009 | Toyoda | C09D 11/30 174/257 |
| 2009/0274833 A1* | 11/2009 | Li | B22F 1/0022 427/123 |
| 2010/0000762 A1* | 1/2010 | Yang | H05K 3/1283 174/126.1 |
| 2010/0003021 A1 | 1/2010 | Hirahara et al. | |
| 2010/0193224 A1* | 8/2010 | Park | H05K 3/1283 174/254 |
| 2011/0165316 A1* | 7/2011 | Baccini | H01L 21/67017 427/8 |
| 2013/0043221 A1 | 2/2013 | Hathaway et al. | |
| 2013/0298989 A1* | 11/2013 | Tomizawa | H01L 31/03762 136/258 |
| 2015/0056382 A1* | 2/2015 | Suganuma | H01B 1/22 427/553 |
| 2015/0189761 A1* | 7/2015 | Chan | C09D 11/52 427/125 |
| 2015/0201504 A1* | 7/2015 | Yaniv | H05K 1/097 427/559 |
| 2015/0239047 A1 | 8/2015 | Welling | |
| 2015/0359095 A1* | 12/2015 | Murakawa | C09D 5/00 174/257 |
| 2016/0041649 A1* | 2/2016 | Uchida | G06F 3/044 345/174 |
| 2016/0116211 A1* | 4/2016 | Weber | F26B 3/30 34/273 |

FOREIGN PATENT DOCUMENTS

| | | |
|---|---|---|
| DE | 102010044299 A1 | 3/2012 |
| EP | 0631098 A1 | 12/1994 |
| EP | 1158836 A2 | 11/2001 |
| GB | 849403 A | 9/1960 |
| JP | S27-2094 | 6/1952 |
| JP | S61-02473 Y2 | 1/1986 |
| JP | S61293572 A | 12/1986 |
| JP | S 62221189 A | 9/1987 |
| JP | H04288471 A | 10/1992 |
| JP | H 04313676 A | 11/1992 |
| JP | H 0716529 A | 1/1995 |
| JP | H11173757 A | 7/1999 |
| JP | 2000164555 A | 6/2000 |
| JP | 2002110326 A | 4/2002 |
| JP | 2007188003 A | 7/2007 |
| JP | 2008309862 A | 12/2008 |
| TW | 332007 U | 5/1998 |

OTHER PUBLICATIONS

Dobrzanski et al., "Final Manufacturing Process of Front Side Metallisation on Silicon Solar Cells Using Conventional and Unconventional Techniques," Strojniski Vestnik—Journal of Mechanical Engineering, vol. 59, No. 3, pp. 175-182 (Mar. 15, 2013).

Office Action dated May 14, 2013 in DE Application No. 102013104577.4.

Radivojevic et al., "Optimised Curing of Silver Ink Jet Based Printed Traces," Proceedings of 12th International Workshop on Thermal Investigations of ICs-Therminic 2006, Nice, France (Sep. 2006).

Cauchois et al., "Impact of variable frequency microwave and rapid thermal sintering on microstructure of inkjet-printed silver nanoparticles," J. Mat. Sci., vol. 47, pp. 7110-7116 (2012).

West et al., "Photonic Sintering of Silver Nanoparticles: Comparison of Experiment and Theory," Sintering Methods and Products, (Shatokha ed.), InTech, pp. 173-188 (2012).

Khan et al., "Laser sintering of direct write silver nano-ink conductors for microelectronic applications," Proceedings of SPIE, vol. 6879 (2008).

Office Action dated Oct. 31, 2016 in JP Application No. 2016-510978.

Office Action dated Jan. 4, 2017 in KR Application No. 10-2015-7031489.

Office Action dated Jun. 1, 2017 in CN Application No. 201480024890.8.

Office Action dated Jan. 30, 2017 in JP Application No. 2016-510978.

* cited by examiner ically conductive and permanent coating of the substrate, it is necessary to dry and sinter the ink coating in a second processing step. The drying process that takes place first contributes to removing volatile components of the ink, for example organic additives or the dispersant. In the metal particle coating remaining on the substrate, however, the metal particles are initially present as individual particles, which must be connected to each other by a subsequent sintering process, in order to produce a conductive coating. High electrical conductivity is achieved, for example, with inks containing nanoparticles made of silver, which have a solids content of approximately 50%.

DEVICE FOR DRYING AND SINTERING METAL-CONTAINING INK ON A SUBSTRATE

CROSS-REFERENCE TO RELATED APPLICATIONS

This application is a Section 371 of International Application No. PCT/EP2014/057258, filed Apr. 10, 2014, which was published in the German language on, Nov. 6, 2014, under International Publication No. WO 2014/177354 A1, and the disclosure of which is incorporated herein by reference.

BACKGROUND OF THE INVENTION

The present invention relates to a device for drying and sintering metal-containing ink on a substrate, comprising multiple optical radiators for irradiating the substrate and a reflector for reflecting radiation onto the substrate, wherein the radiators and substrate are movable relative to each other in a transport direction.

Devices for drying and sintering metal-containing inks in the sense of the invention are used for curing printed layers; they are used, for example, for manufacturing electronic circuit elements, in particular, for manufacturing RFIDs, organic photovoltaics, OLEDs, or printed batteries.

It is known that electronic circuit elements can be produced easily and economically by printing methods. Such electronic circuit elements are therefore also designated as "printed functionalities" or "printed electronics."

In the production of printed electronics, the metal-containing ink is first deposited in a first processing step by a printing process as a thin layer on a suitable substrate, for example a plastic film, paper, or glass. The thickness of the ink layer is usually between 0.3 μm and 3.0 μm. For depositing the ink layer, a number of different printing methods can be used. Screen printing, a roll-to-roll process, or an ink jet printing method is often used. With ink jet printing, the metal-containing ink is transferred drop by drop from an ink-jet printer onto the substrate. This belongs to digital printing methods, because this method creates each image anew.

Inks that are used for the production of printed electronics contain a high percentage of small metal particles, whose particle sizes often lie in the nanometer range. The metal particles are dispersed in an aqueous or organic dispersant. In addition, the inks can contain organic additives, for example for better particle crosslinking, solubility, wettability, or for preventing agglomeration, but also aqueous additives for better processability of the inks.

To produce an electrically conductive and permanent coating of the substrate, it is necessary to dry and sinter the ink coating in a second processing step. The drying process that takes place first contributes to removing volatile components of the ink, for example organic additives or the dispersant. In the metal particle coating remaining on the substrate, however, the metal particles are initially present as individual particles, which must be connected to each other by a subsequent sintering process, in order to produce a conductive coating. High electrical conductivity is achieved, for example, with inks containing nanoparticles made of silver, which have a solids content of approximately 50%.

For the production of printed electronics, a number of drying and sintering processes are used. For example, the ink coating can be dried by the use of heated gases. As gases, for example, air, nitrogen, or noble gases are suitable. However, because substrates made of plastic having a limited thermal stability are often used for the production of printed electronics, the temperature of the heated gases cannot be selected arbitrarily high. Therefore, the use of heated gases usually only dries the coating. The use of gases for drying coatings also has large spatial requirements and leads to long process times.

To nevertheless ensure a quick drying and sintering process, radiation sources are used for irradiating the coated substrate with optical radiation. For these devices, both UV radiation sources, for example mercury vapor discharge lamps or LEDs, are also used as radiation sources that emit NIR radiation, for example pulsed xenon or krypton flash lamps or NIR laser diodes.

For example, U.S. Patent Application Publication 2010/0003021 A1 teaches a device for drying and sintering metal-containing ink with a single radiation source, which is suitable for emitting radiation having wavelengths in the visible, infrared, and/or UV range, for example in the form of a xenon flash lamp. In addition, the device comprises a control unit for controlling the radiation as a function of the optical properties of the cured coating.

However, xenon flash lamps have some disadvantages; they generate periodic radiation having a high power density and are relatively expensive. In addition, for the use of a xenon flash lamp, the irradiation field is not constantly irradiated. In particular, for a quick relative movement of the substrate and flash lamp, the irradiation field might be illuminated inhomogeneously. This can have an effect on the uniform evaporation of volatile components of the metal-containing ink.

It has also been shown that the use of a single radiation source for the simultaneous drying and sintering of metal-containing ink can lead to an incompletely developing sintering process. Simultaneous drying and sintering processes can have the result that surface sintering starts before volatile components have completely evaporated from deeper lying layers of the coating. If these volatile components are further heated during the joint drying and sintering process, microscopic explosions can occur, which might damage the already sintered layer. Such explosions negatively affect the conductivity of the coating.

To prevent this disadvantage, it is proposed in U.S. Patent Application Publication 2013/0043221 A1, from which a device of the type mentioned at the outset is known, to provide a first flash lamp of lower irradiation power for evaporating volatile components and to arrange, downstream of this lamp viewed in the transport direction of the substrate, a separate second flash lamp having higher irradiation output power for sintering the coating.

A separate arrangement of two radiation sources requires a large installation space, in which the radiation sources are arranged; it negatively affects a compact construction of the device. A device having several flash lamps is also complicated to produce and contributes to high manufacturing costs. Flash lamps also have the disadvantages mentioned above; they are expensive and normally designed for high radiation densities.

BRIEF SUMMARY OF THE INVENTION

The invention therefore has the object of providing an efficient device for drying and sintering metal-containing ink, wherein this device enables a homogeneous irradiation of the substrate, has a compact construction, and is also simple and economical to produce.

This object is achieved according to the invention starting with a device for drying and sintering metal-containing ink of the type mentioned at the outset, such that the optical radiators are infrared radiators having a cylindrical radiator tube and a radiator tube longitudinal axis, which emit radiation having a radiation component of IR-B radiation of at least 30% and IR-C radiation of at least 5% of the total radiator output power, and which are arranged in a radiator module, so that their radiator tube longitudinal axes run parallel to each other and perpendicular to the transport direction, and thereby irradiate an irradiation field onto the surface of the substrate, such that this irradiation field is divided into a drying zone and a sintering zone downstream of the drying zone in the transport direction, wherein along a center axis running in the transport direction the drying zone is exposed to an at least 15% lower average irradiation density than the sintering zone.

Starting from a device according to the class for drying and sintering metal-containing inks, two modifications are proposed according to the invention, of which one relates to the type of optical radiator and the other relates to the arrangement of the optical radiator within a radiator module allocated to the irradiation field.

It is a common opinion that good processing results can be achieved in the drying and sintering of metal-containing inks, if optical radiators are used, which generate a narrow band or discrete emission spectrum in the visible or IR-A range (see here: Z. Radivojevic et al., "Optimized Curing of Silver Ink Jet Based Printed Traces," *Proceedings of 12th International Workshop on Thermal Investigations of ICs—Therminic* 2006, Nice: France (2006); R. Cauchois et al., "Impact of Variable Frequency Microwave and Rapid Thermal Sintering on Microstructure of Inkjet-Printed Silver Nanoparticles," *J. Mat. Sci* 47:20 (2012); J. West et al., "Photonic Sintering of Silver Nanoparticles: Comparison of Experiment and Theory," in Volodymyr Shatokha [Ed.], *Sintering—Methods and Products*, InTech (2012); A. Khan et al.: "Laser Sintering of Direct Write Silver Nano-Ink Conductors for Microelectronic Applications," *Proc. SPIE* 6879 (2008)).

In contrast to those publications, the device according to the invention has a plurality infrared radiators whose emission spectrum comprises significant radiation components in the IR-B and IR-C ranges.

Metal-containing inks are a dispersion of solid metal particles in a dispersant. The metal particles themselves have high reflectivity for incident IR-B and IR-C radiation. The IR-B and IR-C radiation emitted by the infrared radiators and the radiation reflected diffusely by the metal particles are distributed within the layer to be dried and are therefore provided mainly for an irradiation of the other components of the metal-containing ink. These components often comprise organic compounds, which have good absorption properties for radiation having wavelengths in this range. The IR-B and IR-C radiation is normally absorbed by the dispersant and volatile substances, so that these components can evaporate. This therefore contributes to good drying of the ink, before the metal particles can be linked together in a sintering process. The use of IR-B and IR-C radiation consequently also leads to a reduced occurrence of micro-explosions in a subsequent sintering process.

The total radiator output power is the integral irradiation output power in watts relative to the emission surface area of the radiator tube arrangement. Good results are achieved if the infrared radiators emit radiation having a radiation component of IR-B radiation of at least 30% of the total radiator output power and radiation having a radiation component of IR-C radiation of at least 5% of the total radiator output power.

It has proven effective in this connection if the infrared radiators also emit radiation components in the visible and IR-A range. Radiation having wavelengths in this range has higher radiation energy in comparison having IR-B and IR-C radiation and is especially suitable for sintering metal particles. IR-A radiation has wavelengths in the range of 0.78 µm to 1.4 µm, the wavelengths of IR-B radiation are in the range of 1.4 µm to 3.0 µm, and those of IR-C radiation are in the range of 3 µm to 1000 µm.

According to the invention it is also provided that the infrared radiators are arranged in a common radiator module. In contrast to multiple separate radiators, such a radiator module requires only one common housing for the infrared radiators and in this way contributes to a compact construction of the device according to the invention.

In addition, the use of infrared radiators having a cylindrical radiator tube enables a compact arrangement of the infrared radiators in the common radiator module. This contributes, according to the invention, to the infrared radiators being arranged parallel to each other having their radiator tube longitudinal axes within the radiator module. At the same time, the parallel arrangement of the radiator tubes produces a surface area radiator, which is suitable for a surface area irradiation of the substrate having high irradiation densities. The arrangement of the infrared radiators also makes a contribution here, whose radiator tube longitudinal axes run transverse to the transport direction. In this connection it has proven effective if the radiator tube longitudinal axes run at an angle range of 45° to 90° offset to the transport direction. In the simplest case, the radiator module is arranged so that the radiator tube longitudinal axes of the infrared radiators run perpendicular to the transport direction.

The radiator module is shaped so that it generates an irradiation field having two different zones, namely having a drying zone and a sintering zone. The term irradiation field is understood to be equal to the size of the orthogonal projection of the radiator module on a plane defined by the substrate.

The drying zone and sintering zone differ in the irradiation density. The irradiation densities of both zones are adapted to the processes that are performed for the drying and sintering of metal-containing ink. Both zones can also have different maximum temperatures and temperature profiles.

The drying zone and sintering zone directly border on each other or are spaced from each other. Between the drying and sintering zones there can be a transition zone, whose irradiation density is in the range between the irradiation density of the drying zone and that of the sintering zone.

In this way, because the radiator module and the substrate can be moved relative to each other in the transport direction, the substrate passes through both the drying zone and the sintering zone. The radiator module is designed so that the substrate first passes through the drying zone and then the sintering zone.

According to the invention, the drying zone has a lower average irradiation density than the sintering zone along a center axis running in the transport direction. The lower irradiation density of the drying zone in comparison with the sintering zone goes along with a lower energy input into the drying zone, so that during the drying few sintering processes can take place. The average irradiation density of the sintering zone is designed for the sintering of the metal particles. In this way, because the coating has already passed through the drying zone, an efficient sintering process is made possible in the sintering zone.

The irradiation densities of the drying zone and sintering zone can be achieved, for example, by a suitable selection of the spacing between adjacent radiators, by the use of different radiator types, or also by the operation of radiators having different operating parameters (for example operating current, operating voltage).

Because the drying zone and sintering zone are generated by a common radiator module, the two zones have a comparatively small spacing from each other. In this way, cooling processes are reduced that could take place during the transport of the substrate from the drying zone to the sintering zone. The radiator module thus contributes to high energy efficiency of the device according to the invention.

In one advantageous embodiment of the device according to the invention, it is provided that the multiple infrared radiators comprise an infrared radiator of a first type having an emission maximum in the wavelength range between 1600 nm and 3000 nm and an infrared radiator of a second type having an emission maximum in the wavelength range between 900 nm and 1600 nm.

Infrared radiators having different emission maximums usually cause a different energy input into the substrate. The use of different infrared radiators can therefore contribute to the formation of an irradiation field having different zones, such as a drying zone and sintering zone. Infrared radiators of the first type emit radiation components that are absorbed, in particular, by volatile components of the metal-containing ink. They are therefore especially suitable for the irradiation of the drying zone. Infrared radiators of the second type show an emission maximum between 900 nm and 1600 nm and therefore usually cause a higher energy input into the substrate. The radiation emitted by them is also absorbed by metal particles. They are therefore suitable for promoting sintering processes. Preferably, the infrared radiators of the second type are provided for irradiating the sintering zone.

In another advantageous embodiment of the device according to the invention, it is provided that multiple infrared radiators of the first type and multiple infrared radiators of the second type are provided, and that adjacent infrared radiators of the first type have a greater spacing from each other than adjacent infrared radiators of the second type.

The spacing between adjacent infrared radiators affects the irradiation density of the irradiation field. A large spacing leads to a lower irradiation density, while a smaller spacing is associated with a higher irradiation density. Preferably, the infrared radiators of the first type are allocated to the drying zone of the irradiation field and the infrared radiators of the second type are allocated to the sintering zone of the irradiation field. Therefore, because the infrared radiators of the first type have a greater spacing from each other than adjacent infrared radiators of the second type, these generate a lower irradiation density. This is advantageous according to the invention especially in the drying zone.

It has proven effective if the infrared radiators emit radiation continuously.

Therefore, because the substrate and the radiation source are movable relative to each other in devices for drying and sintering inks, fluctuations in the irradiation density occur, especially for radiators having discontinuous operation, for example flash lamps. Infrared radiators that emit continuous radiation are therefore suitable especially for uniform irradiation of the substrate. A radiator module having such infrared radiators generates a time constant irradiation field.

In one preferred embodiment of the device according to the invention, the infrared radiators have a broadband emission spectrum, which has radiation components of, together, at least 10% of the total radiator output power in the visible range and in the IR-A range.

Radiators having a broadband emission spectrum can be used both for drying and also for sintering metal-containing ink. In particular, IR-A radiation and radiation having wavelengths in the visible range have, in comparison to IR-B and IR-C radiation, a higher radiation energy and are suitable especially for sintering metal particles. The sintering efficiency here depends on the irradiation density. With use of radiators having an IR-A component less than 30%, the irradiation density in the drying zone and in the sintering zone can be set, for example, by suitable adjustment of the radiator spacing of adjacent radiators.

In another preferred modification of the device according to the invention, it is provided that the irradiation field has a total surface area in the range of 800 cm$^2$ to 6000 cm$^2$, especially preferred in the range of 1500 to 2000 cm$^2$, and the surface areas of the drying zone and the sintering zone each make up at least 30% of the total surface area, preferably the surface area of the drying zone is in the range between 35% and 65% of the total surface area.

The surface area of the irradiation field influences the drying and sintering duration per unit of substrate surface area. An irradiation field having a surface area of less than 800 cm$^2$ leads only to the drying of a comparatively small substrate surface area per unit of time and thus results in high drying costs. A device having an irradiation field having a total surface area of greater than 6000 cm$^2$ and a simultaneously good irradiation density distribution can be produced only with complicated processes.

In addition, it is basically desirable if the surfaces of the drying zone and the sintering zone occupy the largest possible portion of the total surface area. Therefore, for an efficient drying process it has proven effective if the drying and sintering zones make up at least 30% of the total surface area. Because the substrate and radiator module are movable relative to each other, the effective irradiation duration of the substrate depends on the surface area of the drying and sintering zones, respectively. A zone having a large surface area leads to longer irradiation of the substrate in terms of time. To ensure an efficient drying and sintering process, the irradiation duration can be adjusted. This can be realized by a suitable selection of the surface areas of the drying and sintering zones. For a drying/sintering zone having a surface area in the range between 35% and 65% of the total surface area, the ratio of the irradiation duration of the drying and sintering zones can be adjusted in the range between approximately 1:2 and 2:1.

It has proven effective if the drying zone and the sintering zone have the same surface area.

If the drying and sintering zones have the same surface area, an effective irradiation of the substrate in both zones over a comparable time period is ensured.

Advantageously, the drying zone has an average irradiation density of less than 50 kW/m$^2$ along the center axis.

With an average irradiation density of greater than 50 kW/m$^2$, sintering processes can already begin in the drying zone, which can negatively affect the sintering result.

It has proven effective if the sintering zone has an irradiation density of greater than 50 kW/m$^2$ along the center axis.

An irradiation density of greater than 50 kW/m$^2$ is suitable for the sintering of metal particles.

In a preferred embodiment of the device according to the invention, the radiator module is designed for an irradiation of the irradiation field having an average irradiation density in the range of 30 kW/m² to 250 kW/m².

The average irradiation density with respect to the irradiation field has an effect on the energy efficiency of the device. In principle, with respect to the total irradiation field, the lowest possible irradiation density is desirable. However, an average irradiation density of less than 30 kW/m² for sintering the metal-containing ink is suitable only under certain conditions. An irradiation density of greater than 250 kW/m² negatively affects the energy efficiency of the device.

It has proven favorable if the radiator module has a cooling element, preferably a water cooling system arranged on a side of the reflector facing away from the infrared radiators.

Excess heating of the reflector and the infrared radiators contributes to a reduced service life of the device. A cooling element, in particular, a water cooling system, enables effective cooling of the infrared radiators and the reflector. In addition, the substrates used for the production of printed electronics usually have only a limited thermal stability, so that excess heating and damage to the substrate are prevented by the cooling element.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
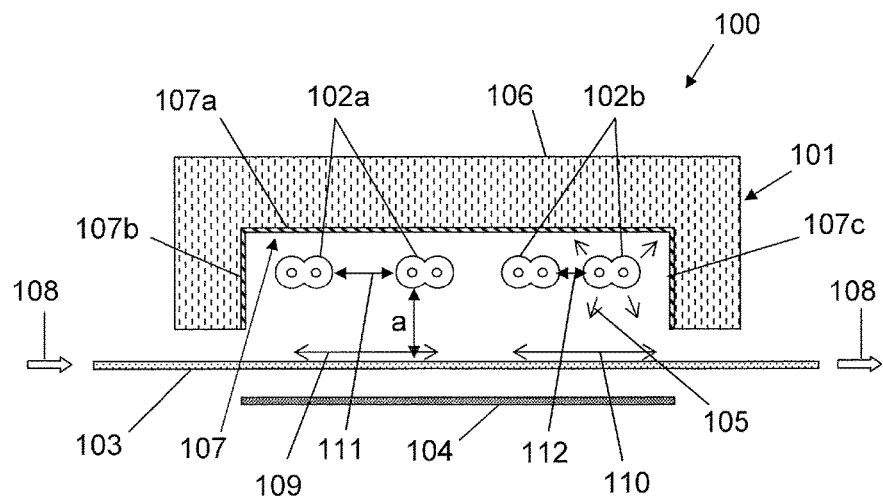
FIG. 1 is a schematic cross-sectional representation of a first embodiment of the device according to the invention for drying and sintering a metal-containing ink.

FIG. 1 shows schematically a first embodiment of the device according to the invention, designated overall by the reference numeral 100. The device 100 is used for drying and sintering metal-containing ink on a substrate 103. It is suitable especially for drying and sintering inks in components for printed electronics, which are manufactured in a roll-to-roll process.

The device 100 comprises a radiator module 101 having four infrared radiators 102a, 102b arranged therein for emitting optical radiation 105, a reflector 107, and also a mirror 104 for reflecting a portion of the radiation 105 emitted by the radiator module 101 onto the substrate 103.

The infrared radiators 102a, 102b are twin tube radiators designed for continuous operation; they have a cylindrical radiator tube having a radiator tube longitudinal axis. The infrared radiators 102a are carbon radiators having a color temperature of 1200° C.; they are allocated to the drying zone and have an emission maximum at a wavelength of approximately 1.9 μm. The infrared radiators 102b are short-wave infrared radiators having a color temperature of approximately 2200° C.; they contribute significantly to generating the sintering zone. The emission maximum of these radiators is at a wavelength of approximately 1.2 μm. Both infrared radiator types 102a, 102b emit radiation having a radiation component of IR-B radiation of greater than 30% and in the IR-C range of greater than 5% of the total radiator output power. In addition, both infrared radiator types 102a, 102b emit greater than 10% of the total radiator output power in the IR-A range and in the visible range.

The infrared radiators 102 are arranged parallel to each other within the radiator module 101 and perpendicular to the transport direction 108.

Adjacent infrared radiators 102a have a spacing 111 from each other of 55 mm, adjacent infrared radiators 102b have a spacing 112 from each other of 38 mm. The spacing a between the bottom side of the infrared radiators 102a, 102b and the substrate is 60 mm. An adjustment unit (not shown) allows a simple adjustment of the spacing a in a range of 35 mm to 185 mm.

The radiator module 101 has a two-sided, angled housing 106 having a side facing the infrared radiators. The reflector 107 is mounted on this side. Therefore, because the reflector 107 has a base reflector 107a and two side reflectors 107b, 107c, a large component of the infrared radiation emitted by the infrared radiators 102 is incident on the substrate 103. The reflector 107 is made of aluminum and suitable for the reflection of infrared radiation having a wavelength in the range of 800 nm to 5000 nm. In an alternative embodiment (not shown), highly reflective coating made of aluminum, silver, gold, copper, nickel, or chromium is mounted on the housing.

The radiator module 101 irradiates an irradiation field on the surface of the substrate 103, which viewed in the transport direction 108 has a drying zone 109 and a sintering zone 110 downstream of the drying zone 109. The radiator module 101 is designed for an irradiation of the irradiation field having an average irradiation density of approximately 150 kW/m². The irradiation field has a total surface area of 1800 cm²; the surface area of the drying and sintering zones is each approximately 750 cm². The drying and sintering zones 109, 110 differ in their average irradiation density. Along a center axis running in the transport direction, the average irradiation density in the drying zone 109 is 50 kW/m² and in the sintering zone 110 is 250 kW/m².

The substrate 103 is a plastic film made of PET having a film thickness of 0.1 mm, which is moved by a transport device (not shown) in the transport direction 108 relative to the radiator module 101. The substrate 103 is moved at a constant advancing speed.

Within the housing 106 there is a cooling element (not shown) for cooling the reflector 107 and the infrared radiators 102. The cooling element is a water cooling system. It contributes to a long service life of the device, especially of the radiators and the reflector layer. In an alternative embodiment, the cooling element is an air cooling system. Here, the cooling element is designed so that the substrate 103, due to its low thermal mass, is not cooled by an air flow coming out from the radiator module 101. This is achieved, for example, by an air heat exchange system for the reflector 107 or an air cooling system for the infrared radiators 102 and the reflector 107 having special air conductance and side air outlet.

Figure 2:
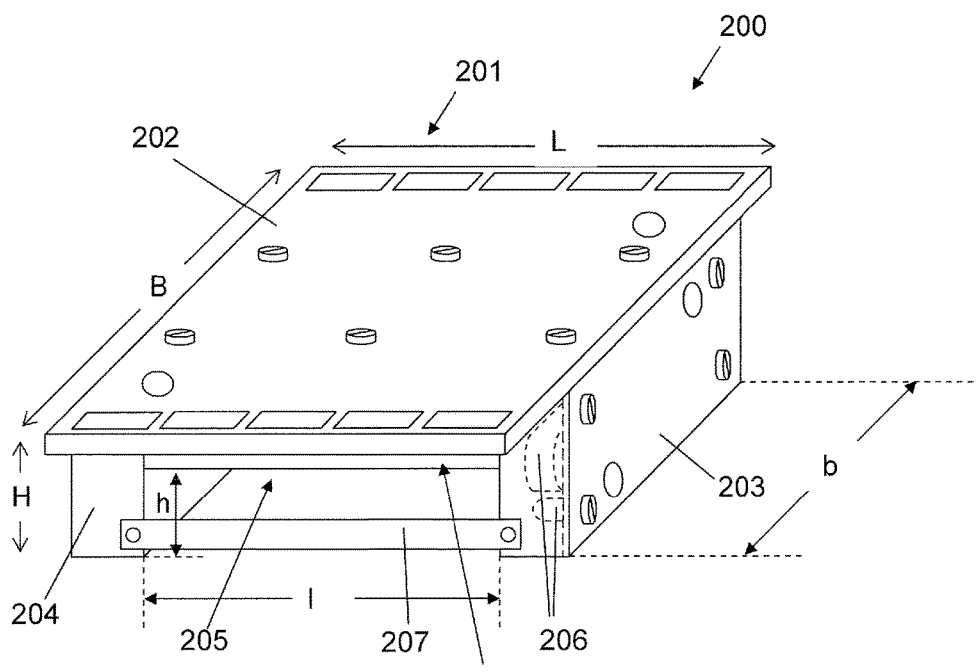
FIG. 2 is a schematic three-dimensional representation of a second embodiment of the device according to the invention.

FIG. 2 shows schematically in three-dimensional representation a radiator module 200 for use in a device according to the invention for drying and sintering metal-containing ink.

The radiator module 200 comprises 12 infrared radiators (not shown), as well as a housing 201 made of several plates 202, 203, 204. The outer dimensions of the radiator module 200 are 650 mm×450 mm×160 mm (L×B×H). Furthermore, an inner reflector 205 is provided, which is mounted on the inner surface of the radiator module housing 201. The inner reflector 205 covers the inner surfaces of the plates 203, 204, 208. Reflector plates 207 are also mounted on the end sides. With the reflector 205, especially the side reflectors on the plates 203, 204, and the reflector plates 207, the greatest possible part of the radiation emitted by the infrared radiators is provided for the irradiation of the substrate. The inner reflector 205 is allocated to the heated areas of the infrared radiators. The unheated ends of the radiators extend out from the area of the reflector 205. The radiator module 200 is designed for the irradiation of an irradiation field having the dimensions 600 mm×350 mm (l×b). The bottom side of the infrared radiators has a spacing h of 50 mm from the substrate.

The infrared radiators are selected and arranged within the radiator module 200 so that the irradiation profile generated by the radiator module 200 on the irradiation field comprises a drying zone and a sintering zone. The infrared radiators are mounted on the unheated ends on the plate 202, such that their position can be adjusted in the longitudinal direction 1 and thus can set various irradiation profiles of the irradiation field.

Within the plates 202, 203, 204 of the housing 201 there is a respective cooling element in the form of a water cooling system 206 for cooling the inner reflector 205 and the infrared radiators.

The plates 202, 203, 204 having cooling elements can be produced by various methods, for example by welding or soldering a meander-shaped U-profile on a flat base plate, by welding or soldering half-tubes on a base plate, or by milling channels in a base plate and then pressing copper tubes into the channels.

Figure 3:
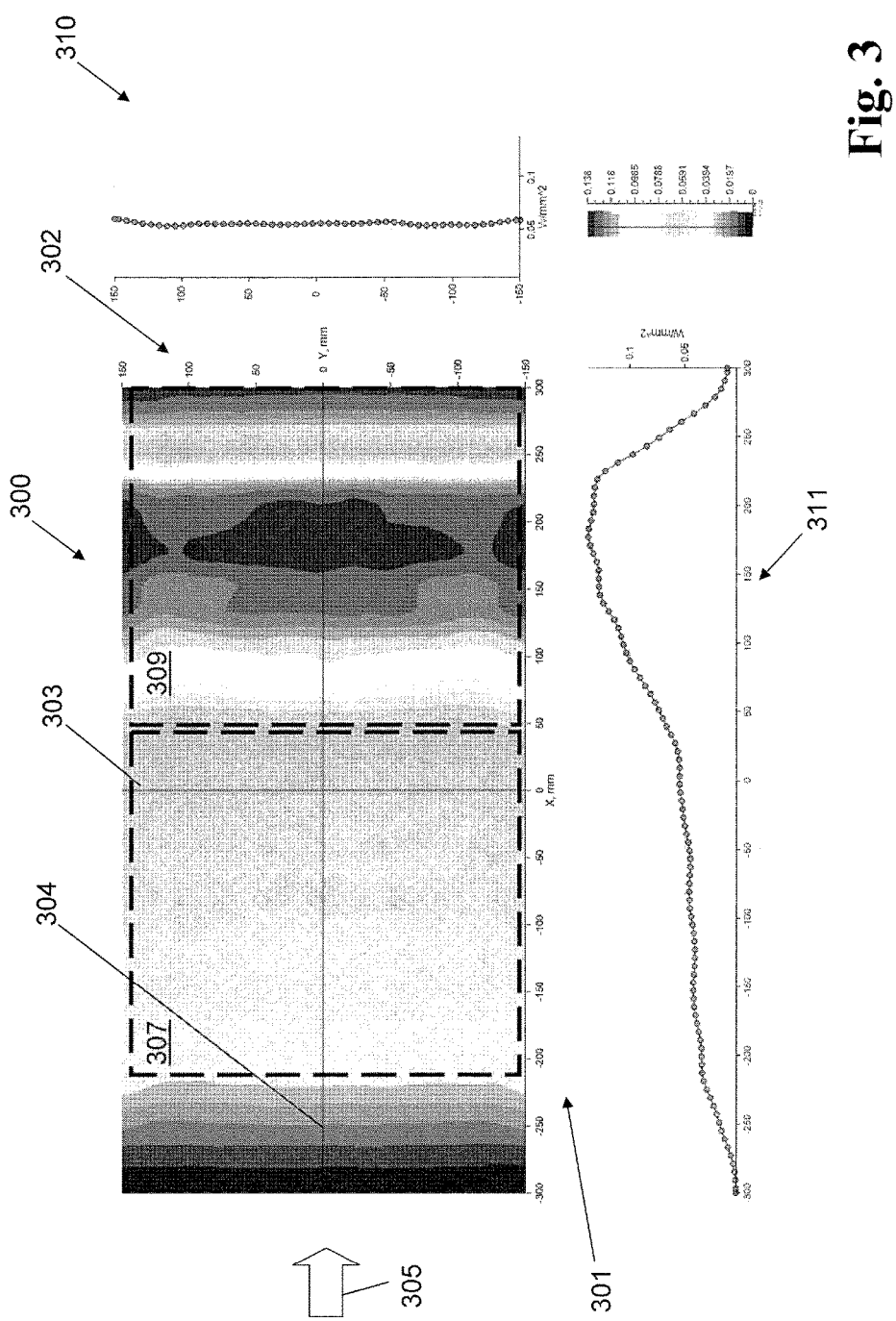
FIG. 3 is a ray-tracing simulation of the irradiation intensity for the second embodiment of the device according to the invention as per FIG. 2.

FIG. 3 shows a ray-tracing simulation of the irradiation intensity of the second embodiment of the device according to the invention. In the diagram 300, the infrared irradiation density is shown in W/mm$^2$ in an irradiation field having a size of 300 mm×600 mm on the surface of a substrate made of PET film. The transport direction of the PET film relative to the radiator module of the device is indicated in FIG. 3 by the arrow 305.

The ray-tracing simulation is based on the radiator module 200; it is distinguished by an irradiation width w of 350 mm, an irradiation length l of 600 mm, and a height h of 50.5 mm.

The radiator module 200 is equipped with eight IR twin tube radiators, of which four have an output power of 2×2.725 kilowatt (sintering zone) and four have an output power of 2×1200 watt (drying zone), wherein only one channel is active for each. Adjacent twin tube radiators in the drying zone have a spacing of 70 mm and in the sintering zone of 45 mm.

The spacing of the radiator bottom sides from the PET surface is 50 mm. On the side of the radiator module facing the PET film, a reflector is applied in the form of a gold coating.

On the abscissa 301 of the diagram 300, the magnitude of the irradiation field in the x-direction is plotted in mm; the ordinate 302 shows the extent of the irradiation field in the y-direction. The diagram 300 shows the distribution of the irradiation intensity in the irradiation field in gray-scale representation.

The irradiation field is divided by a center axis 304 running in the transport direction 305 and a vertical 303 running perpendicular to the center axis 304 into four equal-size sub-areas.

The ray-tracing simulation shows an irradiation field that comprises two irradiation zones, namely a drying zone 307 and a sintering zone 309. The drying zone 307 has, along the center axis 304, an average irradiation density of approximately 50 kW/m$^2$. The irradiation density along the center axis 304 is 135 kW/m$^2$ in the sintering zone.

The diagram 310 also shows the profile of the irradiation intensity in W/mm$^2$ in the direction of the vertical 303. The diagram 311 shows the profile of the irradiation intensity along the center axis 304.

Example

A plastic film made of polyethylene naphthalate (PEN) having a film thickness of 100 μm is printed with an inkjet printer (Dimatix DMP283; Dropspace 25/30 μm) having metal-containing ink. As the ink, a dispersion of silver nanoparticles (20 wt. %) in organic solvents is used (Suntronic® Jet Silver U5603).

The printed plastic film is then dried with a device that comprises a radiator module having 2×2 short-wave infrared radiators having a cylindrical radiator tube. The heated length of the radiator tubes is 150 mm. A gold reflector is applied to the side of the radiator tubes facing away from the coating. The infrared radiators have a wide wavelength spectrum and a color temperature less than 2500° C. They are designed for an electrical output power of 4×0.7 kW. The power per surface area of the radiator is 50 kW/m$^2$. The spacing of the radiators to the film is approx. 50 mm. On the bottom side of the film there is a ceramic filter board radiation converter. The spacing of the radiation converter to the bottom side of the film is approximately 120 mm.

For the drying and sintering of the ink layer, the film is moved in the transport direction with an advancing speed of 4 cm/s relative to the radiator module. The processing time is 10 s (for comparison: processing time with hot air (140° C.): 40 s).

The sintered coating has good electrical conductivity; its resistance is 3 Ohm.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A device for drying and sintering metal-containing ink on a substrate, the device comprising multiple optical radiators for irradiating the substrate and a reflector for reflecting radiation onto the substrate, the optical radiators and substrate being movable relative to each other in a transport direction, wherein the optical radiators are infrared radiators having a cylindrical radiator tube and a radiator tube longitudinal axis, the optical radiators emitting an IR-B radiation component of at least 30% and an IR-C radiation component of at least 5%, each based on total radiator output power, the optical radiators being arranged in a radiator module such that their radiator tube longitudinal axes run parallel to each other and transverse to a transport direction of the substrate, wherein the optical radiators irradiate an irradiation field on a surface of the substrate, such that the irradiation field is divided into a drying zone and a sintering zone downstream of the drying zone in the transport direction, and wherein the drying zone is exposed to at least 15% less average irradiation density than the sintering zone along a center axis running in the transport direction.

2. The device according to claim 1, wherein the multiple infrared radiators comprise an infrared radiator of a first type having an emission maximum in a wavelength range between 1600 nm and 3000 nm and an infrared radiator of a second type having an emission maximum in a wavelength range between 900 nm and 1600 nm.

3. The device according to claim 2, wherein multiple infrared radiators of the first type and multiple infrared radiators of the second type are provided, and wherein adjacent infrared radiators of the first type have a greater spacing relative to each other than adjacent infrared radiators of the second type.

4. The device according to claim 1, wherein the infrared radiators emit radiation continuously.

5. The device according to claim 1, wherein the infrared radiators have a broadband emission spectrum having visible range and IR-A range radiation components which together equal at least 10% of the total radiator output power.

6. The device according to claim 1, wherein the irradiation field has a total surface area in a range of 800 cm$^2$ to 6000 cm$^2$, and wherein surface areas of the drying zone and the sintering zone each make up at least 30% of the total surface area.

7. The device according to claim 6, wherein the surface area of the drying zone is in a range between 35% and 65% of the total surface area.

8. The device according to claim 6, wherein the drying zone and the sintering zone have a same amount of surface area.

9. The device according to claim 1, wherein the drying zone has an average irradiation density of less than 50 kW/m$^2$ along the center axis.

10. The device according to claim 1, wherein the sintering zone has an irradiation density of greater than 50 kW/m$^2$ along the center axis.

11. The device according to claim 1, wherein the radiator module is designed for an irradiation of the irradiation field having an average irradiation density in a range of 30 kW/m$^2$ to 250 kW/m$^2$.

12. The device according to claim 1, wherein the radiator module has a cooling element arranged on a side of the reflector facing away from the infrared radiators.

13. The device according to claim 12, wherein the cooling element is a water cooling system.

* * * * *